(12) United States Patent
Pyeon

(10) Patent No.: US 8,081,529 B2
(45) Date of Patent: *Dec. 20, 2011

(54) CIRCUIT AND METHOD FOR TESTING MULTI-DEVICE SYSTEMS

(75) Inventor: Hong Beom Pyeon, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/030,785

(22) Filed: Feb. 18, 2011

(65) Prior Publication Data

US 2011/0141835 A1    Jun. 16, 2011

Related U.S. Application Data

(63) Continuation of application No. 12/698,585, filed on Feb. 2, 2010, now Pat. No. 7,911,860, which is a continuation of application No. 12/391,810, filed on Feb. 24, 2009, now Pat. No. 7,679,976, which is a continuation of application No. 11/565,327, filed on Nov. 30, 2006, now Pat. No. 7,508,724.

(51) Int. Cl.
*G11C 7/00* (2006.01)

(52) U.S. Cl. ............. 365/200; 365/201; 365/189.01

(58) Field of Classification Search .......... 365/200, 365/201, 189.01
See application file for complete search history.

(56) References Cited

U.S. PATENT DOCUMENTS

| | | | |
|---|---|---|---|
| 5,132,635 | A | 7/1992 | Kennedy |
| 5,185,722 | A | 2/1993 | Ota |
| 5,430,735 | A | 7/1995 | Sauerwald |
| 5,521,870 | A | 5/1996 | Ishikawa |
| 5,579,272 | A | 11/1996 | Uchida |
| 5,691,949 | A | 11/1997 | Hively |
| 5,862,088 | A | 1/1999 | Takemoto |

(Continued)

FOREIGN PATENT DOCUMENTS

CA    1281775    3/1991

(Continued)

OTHER PUBLICATIONS

IEEE Standard for High-Bandwidth Memory Interface Based on Scalable Coherent Interface (SCI) Signaling Technology (RamLink), IEEE Std., 1596.4-1996, The Institute of Electrical Electronics Engineers, Inc., Mar. 1996, p. i-91.

*Primary Examiner* — Connie Yoha

(74) *Attorney, Agent, or Firm* — Mukundan Chakrapani; Borden Ladner Gervais LLP

(57) ABSTRACT

A method and system for high speed testing of memories in a multi-device system, where individual devices of the multi-device system are arranged in a serial interconnected configuration. High speed testing is achieved by first writing test pattern data to the memory banks of each device of the multi-device system, followed by local test read-out and comparison of the data in each device. Each device generates local result data representing the absence or presence of a failed bit position in the device. Serial test circuitry in each device compares the local result data with global result data from a previous device. The test circuitry compresses this result of this comparison and provides it to the next device as an updated global result data. Hence, the updated global result data will represent the local result data of all the previous devices.

18 Claims, 10 Drawing Sheets

U.S. PATENT DOCUMENTS

| | | |
|---|---|---|
| 5,913,928 A | 6/1999 | Morzano |
| 5,926,422 A | 7/1999 | Haukness |
| 6,185,708 B1 | 2/2001 | Sugamori |
| 6,295,618 B1 | 9/2001 | Keeth |
| 6,426,912 B2 | 7/2002 | Toda |
| 6,484,278 B1 | 11/2002 | Merritt |
| 6,611,469 B2 | 8/2003 | Williams |
| 6,714,466 B2 | 3/2004 | Park |
| 6,894,524 B1 | 5/2005 | Grilletto |
| 6,930,936 B2 | 8/2005 | Santin |
| 6,999,361 B2 | 2/2006 | Keeth |
| 7,139,673 B1 * | 11/2006 | Vashi et al. .................. 702/122 |
| 7,230,861 B2 | 6/2007 | Inoue |
| 7,254,763 B2 * | 8/2007 | Aadsen et al. ................ 714/733 |
| 7,315,480 B2 | 1/2008 | Lee |
| 7,508,724 B2 * | 3/2009 | Pyeon ........................... 365/201 |
| 7,661,043 B2 | 2/2010 | Sato |
| 7,679,976 B2 * | 3/2010 | Pyeon ........................... 365/200 |
| 7,757,134 B2 * | 7/2010 | Kobayashi .................... 714/719 |
| 7,911,860 B2 * | 3/2011 | Pyeon ........................... 365/200 |
| 2003/0107937 A1 | 6/2003 | Williams |
| 2005/0105350 A1 | 5/2005 | Zimmerman |
| 2006/0107142 A1 | 5/2006 | Inoue |
| 2006/0107186 A1 | 5/2006 | Cowell |
| 2006/0168491 A1 | 7/2006 | Lee |
| 2006/0242492 A1 | 10/2006 | Hoffman |
| 2007/0022349 A1 | 1/2007 | Bertocelli |
| 2009/0006837 A1 | 1/2009 | Rothman |

FOREIGN PATENT DOCUMENTS

| | | |
|---|---|---|
| CA | 2074750 | 3/1993 |

* cited by examiner

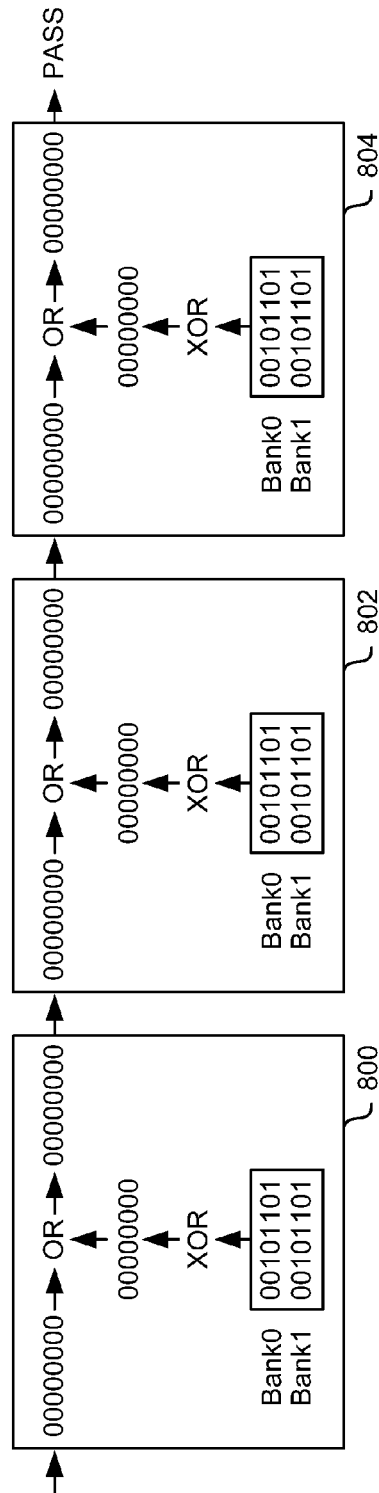
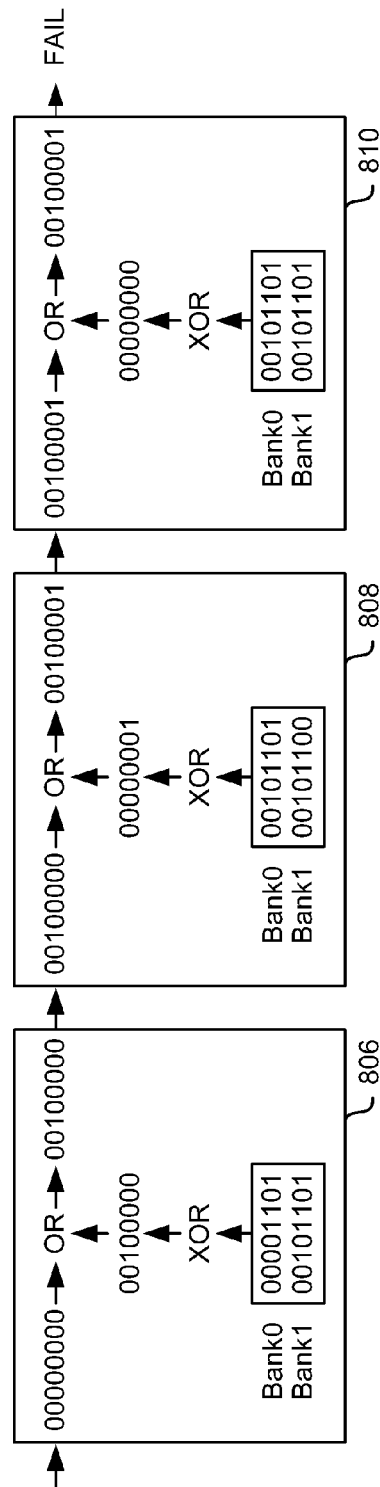
Figure 8a
Figure 8b

//ription>
CIRCUIT AND METHOD FOR TESTING MULTI-DEVICE SYSTEMS

CROSS REFERENCE TO RELATED APPLICATIONS

This application is a Continuation of U.S. patent application Ser. No. 12/698,585, filed on Feb. 2, 2010, which issued as U.S. Pat. No. 7,911,860 on Mar. 22, 2011, which is a Continuation of U.S. patent application Ser. No. 12/391,810, filed on Feb. 24, 2009, which issued as U.S. Pat. No. 7,679,976 on Mar. 16, 2010, which is a Continuation of U.S. patent application Ser. No. 11/565,327 filed on Nov. 30, 2006, which issued as U.S. Pat. No. 7,508,724 on Mar. 24, 2009.

FIELD OF THE INVENTION

The present invention relates generally to the testing of multi-device systems. More particularly, the present invention relates to the testing of interconnection multi-device systems.

BACKGROUND OF THE INVENTION

Semiconductor memory devices are important components in presently available industrial and consumer electronics products. For example, computers, mobile phones, and other portable electronics all rely on some form of memory for storing data. While many memory devices are typically available as commodity devices, the need for higher integration has led to the development of embedded memory, which can be integrated with systems, such as microcontrollers and other processing circuits.

Unfortunately, the density of commodity memory cannot match the ever-increasing demand for memory. Hence multiple commodity memories are used together to fulfill the system memory requirements. FIG. 1 shows a known a multi-device memory configuration. Multi-device memory systems can be implemented as a set of silicon chips grouped together in a single package (called a multi chip system—MCP), or a multiplicity of memory device packages grouped together on a printed circuit board.

FIG. 1 is a block diagram of a prior art multi-device system arranged in a multi-drop, or parallel, configuration. Multi-device system 100 includes a memory controller 102 and memory devices 104, 106, 108 and 110. The memory controller 102 is the interface between the memory devices and the system (not shown), while memory devices 104, 106, 108 and 110 can be any type of memory device, or system including embedded memory. While four memory devices are shown, those skilled in the art will understand that multi-device system 100 can include any number of memory devices, but all sharing a common set of read and write data buses. Hence, any one of the memory devices can provide read data through the common set of read databuses, when instructed to through the memory controller 102.

Those skilled in the art understand that multi-device systems, such as the one shown in FIG. 1, is tested at the individual component level and at the system level to ensure robustness of operation. In particular, memory devices are tested at the chip level to ensure that their memory cells are not defective. A defective memory cell is one which does not store data properly, due to fabrication defects or other defects which may occur during fabrication or assembly of the memory device.

One known technique for testing memory devices is the scheme of writing identical test data into two memory banks and then comparing the read out data from a read operation. Those skilled in the art will understand that a memory device can include any number of memory banks, but two are used in the present discussion as examples only. If the memory banks work according to design specifications, the data from one memory bank will match the data from the other memory bank. Otherwise, there is a defective memory cell and the memory device as a whole is considered defective. The conceptual approach of this technique is illustrated in FIG. 2. Test pattern data is first written to two memory banks 202 and 204 of a memory device. This can be done quickly since the same data can be written concurrently into both memory banks 202 and 204. Then the data of both banks 202 and 204 is read out one bit at a time, such that data from bank 202 is compared with data from bank 204 by a logical exclusive OR (XOR) circuit 206. Single bit signal PASS is provided by XOR circuit 206 to indicate the status of the comparison. Differences between the data content of the memory banks will indicate failure of a memory cell. Once identified, defective cells can be replaced with redundant cells using well known redundancy schemes, thereby salvaging an otherwise defective memory device.

Unfortunately, the primary issue with testing is the time required for testing all the memory cells of every memory device of the system. In the previous example, the data of one memory cell of memory bank 202 is compared with the data of one memory cell of memory bank 204. Therefore long testing times will result if all memory devices are tested in sequence, which adds cost to the production cycle of the memory device.

U.S. Pat. No. 5,579,272 to Uchida, entitled "Semiconductor Memory Device with Data Compression test Function and its Testing Method", addresses the problem of testing time by using data compression. Data compression involves simultaneously testing several memory cells and representing the test result with a number of bits that is smaller than the number of memory cells tested. The most common approach to data compression is to compress multiple bits into a single bit output that indicates a failure when at least one of the input bits indicates a failure. The drawback of this approach is that multiple memory cells are declared faulty in cases where only a single cell is truly defective, although it is possible to mitigate this problem, as illustrated by U.S. Pat. No. 5,913,928 to Morzano, entitled "Data Compression Test Mode Independent of Redundancy." In Morzano, a failure indication in the compressed test result is followed by individual testing to isolate the defective cells.

Because of the economies that can be achieved by reducing testing time, various efforts have been made to improve upon the circuitry used to compare memory cells and compress the test results. U.S. Pat. No. 5,926,422 to Haukness entitled "Integrated Circuit Memory Device Having Current-Mode Data Compression Test Mode", U.S. Pat. Nos. 6,295,618 and 6,999,361 to Keeth entitled "Method and Apparatus for Data Compression in Memory Devices", and U.S. Pat. No. 6,930,936 to Santin entitled "Data Compression Read Mode for Memory Testing" are all examples of patents directed to increasing the speed of the comparison and compression circuitry in a memory device.

Using these well-known techniques, it has been possible to maintain low testing times for individual memory devices in single chip packages despite their increasing size and complexity. It has even been possible to achieve low testing times in multi-device packages arranged in a multi-drop configuration, such as the one illustrated in FIG. 1. The low testing times are still possible in a multi-drop configuration because the memory devices inside the chip can be tested in parallel The difficulties inherent in testing serially interconnected devices have long been known, as illustrated by U.S. Pat. No. 5,132,635 to Kennedy, entitled "Serial Testing of Removable Circuit Boards on a Backplane Bus", which illustrates the sequential nature of such testing. The drawback of such sequential testing is that each device is tested in sequence, and therefore a multi-device system containing N chips takes N times as long to test as N single-chip packages or a multi-drop package having the same number of chips.

It is noted that most memory devices should be flexible enough to be used, and tested, in both a multi-drop and serially configured multi-device memory system. As previously discussed, testing of a multi-drop memory system can be done quickly. However, additional dedicated circuits may be required for carrying out multi-device system level testing for serial interconnected configurations. Therefore, the complexity and size of test circuits should be minimized to keep design, fabrication and testing costs minimized.

It is, therefore, desirable to provide a testing scheme for a multi-device memory system arranged in a serial interconnected configuration that can achieve high testing speeds. It is further desirable to minimize the amount of additional test circuits required for implementing the testing scheme.

SUMMARY OF THE INVENTION

It is an object of the present invention to obviate or mitigate at least one disadvantage of previous serially interconnected multi-chip or multi-device systems by compressing the test results of each device in the serial interconnected configuration, with the test results of the previous chip in the system.

In a first aspect, the present invention provides test circuit for a memory device having a serial input connection, and a serial output connection. The test circuit includes a local comparison circuit and a compression circuit. The local comparison circuit compares data of at least two memory cells with each other, and provides local result data corresponding to a fail status if one of the at least two memory cells is defective. The compression circuit logically OR's the local result data with a global result data received from the serial input connection, for providing updated global result data to the serial output connection. The updated global result data corresponds to the fail status if at least one of the local result data and the global result data corresponds to the fail status. According to an embodiment of the present aspect, the test circuit further includes a first stage test path selector for selectively passing one of the local result data and local memory data, the first stage test path selector passing the local result data to the compression circuit in response to a test mode signal. The test circuit can further include a second stage test path selector for selectively passing one of the local result data and global memory data, the second stage test path selector passing the local result data to the serial output connection in response to the test mode signal. The local comparison circuit can include logic circuitry for receiving the data from the at least two memory cells, the logic circuitry being configured to provide the local result data corresponding to a fail status when the data mismatch a predetermined pattern. The local comparison circuit can include an exclusive OR circuit for receiving the data from the at least two memory cells, the local result data being provided by the exclusive OR circuit.

In further aspects of the present embodiment, the compression circuit includes an OR circuit for receiving the global result data and the local result data, the OR circuit providing the updated global result data. The memory device includes a device selector for selectively passing one of the local memory data and the global memory data as the memory data, the local data being received from one of the at least two memory banks and the global data being received from the serial input connection. Each of the at least two memory cells can be located in different segregated memory areas or can be located in the same segregated memory area. The memory device includes a parallel to serial register for receiving and storing the local result data, the parallel to serial register being at least n-bits wide for receiving n-bit wide local result data in parallel and for serially outputting one bit of the n-bit wide local result data synchronously to a clock. The memory device can include a flip-flop circuit for receiving the global result data received from the serial input connection and for providing one bit of the global result data synchronously to the clock.

In a second aspect, the present invention provides memory system. The system includes a first memory device operable in a test mode for providing a single-bit global result data, the single-bit global result data corresponding to a first memory device cell defect, and a second memory device operable in the test mode for receiving the single-bit global result data, the second memory device providing an updated single-bit global result data corresponding to at least the one first memory device cell defect and a second memory device cell defect. According to an embodiment of the present aspect, the system further includes a memory controller for providing default pass data and for receiving the updated single-bit global result data, during the test mode of operation. The memory controller can include test circuitry, which can include a providing circuit for providing default pass data and a receiving circuit for receiving the updated single-bit global result data, during the test mode of operation. The providing circuit and the receiving circuit can be dedicated circuits.

According to another embodiment of the present aspect, the first memory device includes a first local comparison circuit for detecting the first memory device cell defect and for providing first local result data, and a first compression circuit for providing the single-bit global result data corresponding to a status of the first local result data. In yet another embodiment, the second memory device includes a second local comparison circuit for detecting the second memory device cell defect and for providing second local result data, and a second compression circuit for executing a logical OR function upon the single-bit global result data from the first memory device and the second local result data. The second compression circuit provides an updated single-bit global result data corresponding to an output of the logical OR function. The first local comparison circuit can include a first exclusive OR circuit for detecting the first memory device cell defect, and the second local comparison circuit can include a second exclusive OR circuit for detecting the second memory device cell defect. The first compression circuit can include a first OR circuit for receiving the default pass data and the first local result data, and the second compression circuit can include a second OR circuit for receiving the single-bit global result data and the second local result data.

In a third aspect, the present invention provides a method for testing a memory system. The method includes a) comparing at least two memory cells in a memory device for detecting one memory cell defect; b) providing a local result data corresponding to a fail status when the one memory cell defect is detected, the local result data corresponding to a pass status in an absence of the one memory cell defect; c) comparing the local result data to global result data, the global result data corresponding to one of the fail status and the pass status; and, d) providing updated global result data from the memory device, the updated global result data having a status corresponding to the fail status if at least one of the global result data and the local result data corresponds to the fail status.

Embodiments of the present aspect are as follows. The local result data, the global result data and the updated global result data are single-bit signals. The step of comparing at least two memory cells is preceded by writing identical test data to all the memory cells of the memory device. The step of comparing at least two memory cells includes reading data corresponding to the at least two memory cells, and the step of providing includes executing an exclusive OR operation upon the data of the at least two memory cells for providing the local result data. The step of comparing includes receiving the global result data externally from the memory device. The step of providing the updated global result data includes logically OR'ing the global result data with the local result data for providing the updated global result data. The global result data is provided by a previous memory device or by a memory controller, and if by a memory controller, the global result data is preset to have the pass status. The updated global result data is provided to a subsequent memory device, a memory controller or to a tester system.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 7b is a timing diagram showing the operation of the system of FIG. 7a;

FIG. 8a is a block diagram showing an example testing method operation according to an embodiment of the present invention when there are no defects in the memory devices;

FIG. 8b is a block diagram showing an example testing method operation according to an embodiment of the present invention when there are defects in the memory devices.

DETAILED DESCRIPTION

Generally, the present invention provides a method and system for high speed testing of memories in a multi-device system, where individual devices of the multi-device system are arranged in a serially interconnected configuration. The preferred embodiments of the invention are directed to a final testing of multi-device systems that have been assembled or packaged. At this point, the individual devices have already been subjected to testing, validation, and in those cases where necessary, redundancy implementation. However, mechanical and electrical stress involved during the handling and packaging of the multi-device system can cause further failures. Therefore, since the devices are assembled or packaged, any memory bit failure discovered in any individual device renders the entire system defective.

From this point forward, references to multi-device systems will include multi-device systems integrated within a single package, systems having multiple discrete devices interconnected on a printed circuit board, or multiple devices integrated within the same semiconductor chip. Memory banks, memory areas and memory blocks are intended to be considered a type of segregated memory, where the segregated portions are addressable for read and write operations.

Figure 1:
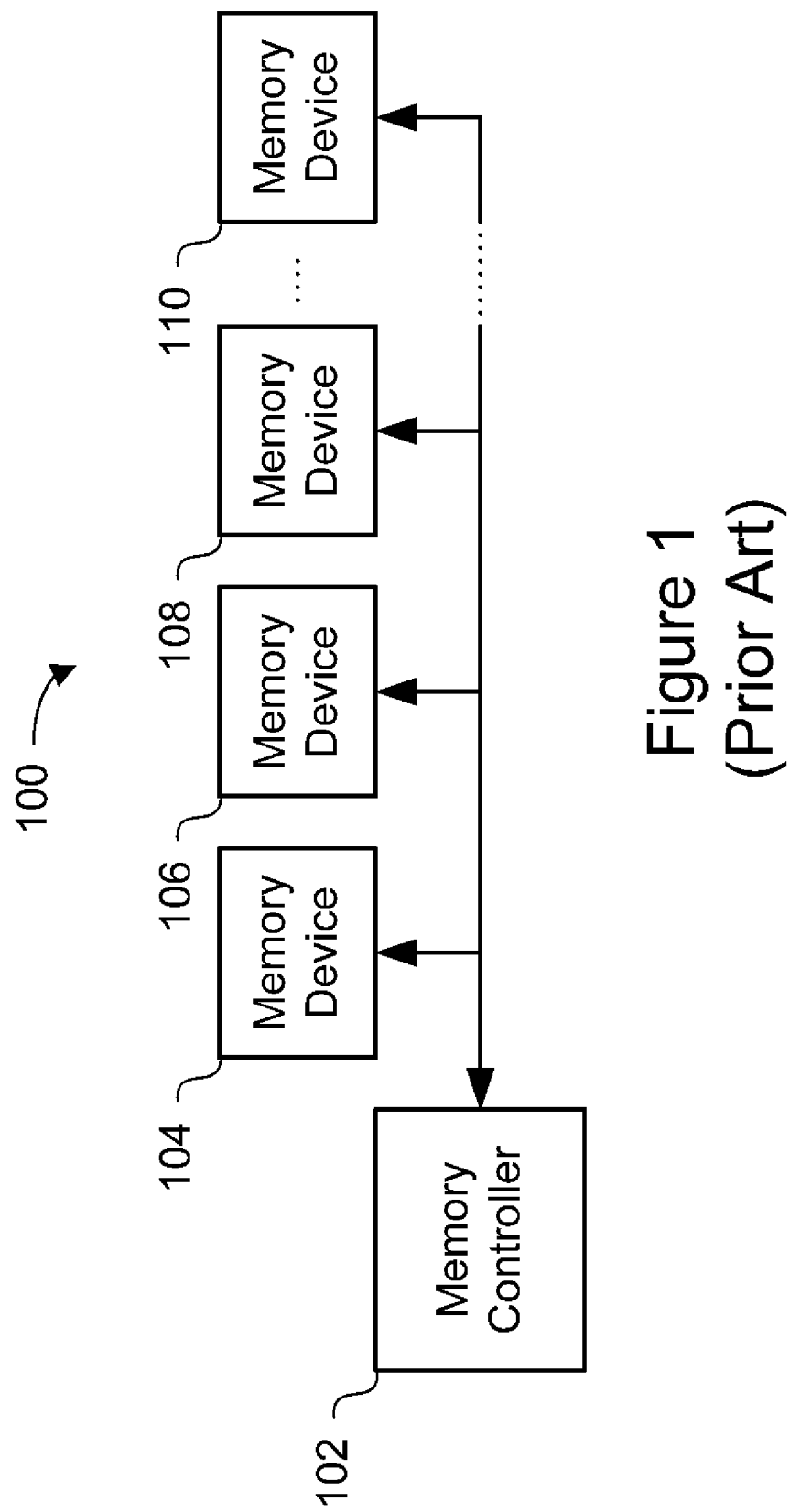
FIG. 1 is a block diagram of a prior art multi-device package arranged in a multi-drop configuration.
Figure 3A:
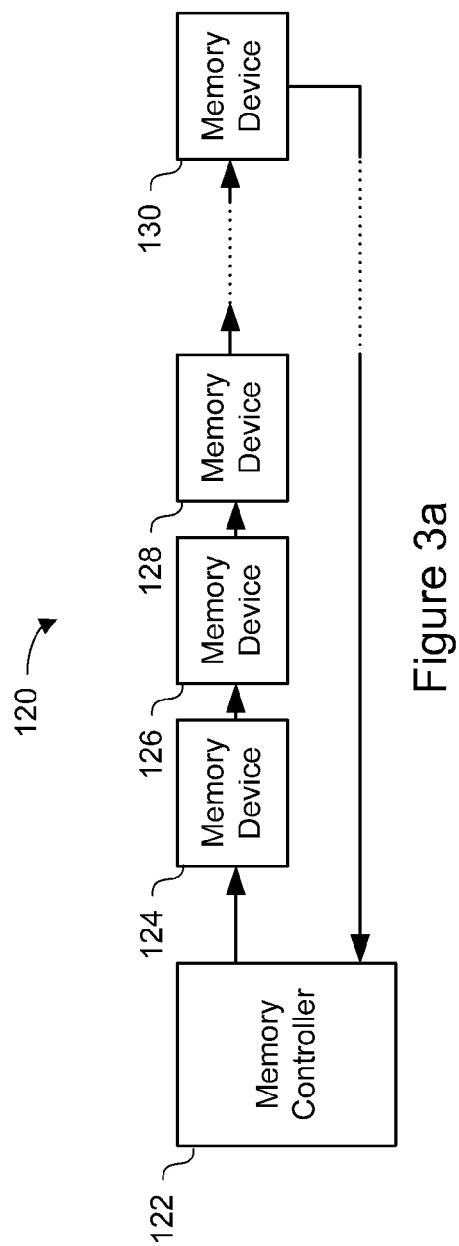
FIG. 3a is a block diagram of a multi-device package arranged in a serial interconnected configuration, to which an embodiment of the present invention is applicable.

FIG. 3a is a block diagram of a multi-device package arranged in a serial interconnection to which an embodiment of the present invention is applicable. Those skilled in the art will understand that a serial interconnection refers to a physical arrangement of devices where two or more devices are serially interconnected to each other. Multi-device system 120 includes a memory controller 122 and memory devices 124, 126, 128 and 130. The components shown in FIG. 3a can be identical to those previously described for the multi-device system 100 of FIG. 1. In FIG. 3a, the memory devices are connected serially, such that the output of one memory device is provided to an input of the next memory device. The input of the first memory device and the output of the last memory device are connected to the memory controller 122. Hence, both instructions and data are transferred from memory device to memory device. The number of memory devices can be any number. The configuration of the serial interconnection of multiple devices is disclosed by U.S. patent application Ser. No. 11/324,023 filed Dec. 30, 2005 assigned to the common assignee, the contents of which are entirely incorporated herein by reference.

According to an embodiment of the present invention, simultaneous testing is possible in a multi-device package arranged in a serial interconnection, regardless of the serial nature of the configuration in which the individual memory devices are physically or logically arranged within the package. In a case where the location of the defect in the serial interconnection can be identified, it is preferable to store the addresses of fail locations in a test system or a memory controller that has a test capability. Individual tests may follow thereafter.

In an embodiment of the present invention, high speed testing is achieved by first writing test pattern data to the memory banks of each device of the multi-device system, followed by local test read-out and comparison of the data in each device. Each device generates local result data representing the absence or presence of a failed bit position, or defect, in the device. Serial test circuitry in each device compares the local result data with global result data from a previous device. The test circuitry compresses this result of this comparison and provides it to the next device as an updated global result data. Hence, the updated global result data will represent the local result data of all the previous devices.

According to the embodiments of the present invention, a final global result data provided from the last device in the serial interconnection corresponding to a "pass", indicates there are no defects in any of the memory devices. On the other hand, a final global result data corresponding to a "fail" indicates that there is at least one memory cell amongst the memory banks of all the devices that is defective. In preferred embodiments of the present invention, each local result data and each global result data is a single-bit data signal. Since only a single bit of data propagates from device to device, the test logic is simple and does not require significant silicon area to implement.

Figure 2:
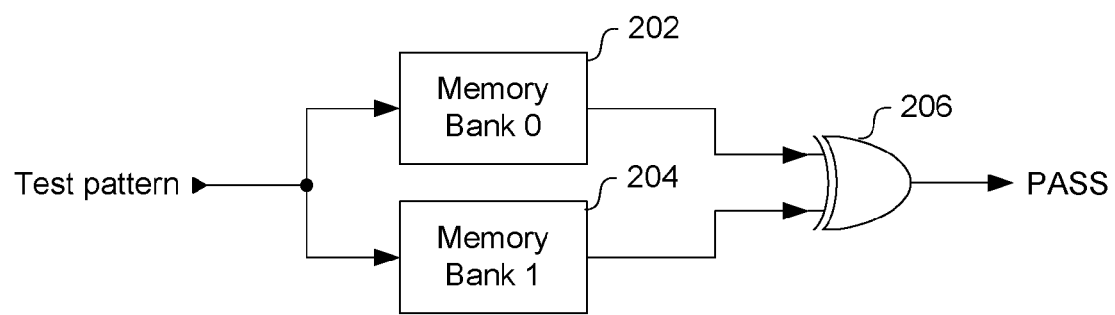
FIG. 2 is a block diagram of the prior art memory device testing scheme.
Figure 3B:
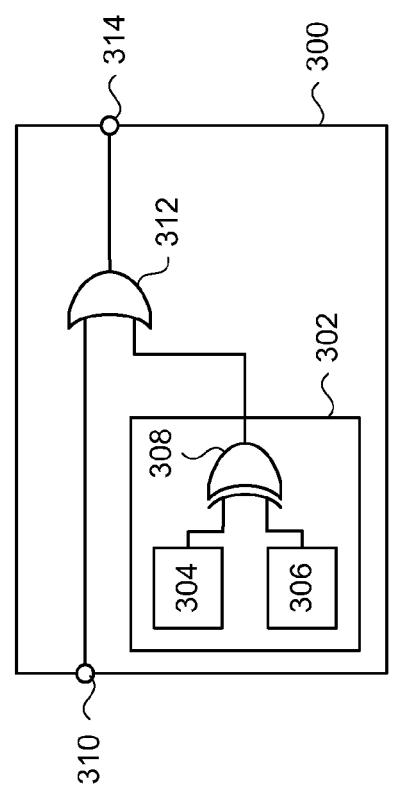
FIG. 3b is a block diagram of a memory device having compression test circuitry according to an embodiment of the present invention.

FIG. 3b is a block diagram of a memory device according to an embodiment of the present invention. More specifically, memory device 300 is shown to include a memory circuit 302 including a local memory test circuit, which can be of the type illustrated in FIG. 2, but may also be any other logic circuit capable of indicating whether one of its memory banks contains defects. In the present embodiment, memory circuit 302 includes a first memory bank 304 and a second memory bank 306, both coupled to a test circuit including a XOR circuit 308. The memory device 300 further includes an input terminal 310 for connection to a previous device (not shown), a compression circuit 312, and an output terminal 314 for connection to a next device (not shown). The compression circuit 312 is illustrated as a simple OR logic circuit, but can be implemented with any logic circuit, or circuits, capable of combining the signals received from input terminal 310 and memory circuit 302. The input terminal 310 receives single-bit global result data from the output terminal 314 of a previous device in the system. During a test mode of operation, the compression circuit 312 logically compresses, or combines, the global result data received from the input terminal 310 with local result data from a local comparison circuit, presently embodied as XOR circuit 308 in the memory circuit 302.

If the comparison between the data from the input terminal 310 and the XOR circuit 308 indicates a failure, the compression circuit 312 will provide a "fail" signal via the output terminal 314. Otherwise, a "pass" signal is provided. According to the preferred embodiment, the "pass" and "fail" status is represented by a single bit of data. The signal, called updated global result data, transmitted from the output terminal 314 is then provided to the input terminal 310 of the next memory device 300 in the system. Therefore, each compression circuit 312 updates the global result data received from the input terminal 310 with the local result data, to provide an updated global result data. Detailed embodiments of the test circuitry will be discussed later.

Figure 4A:
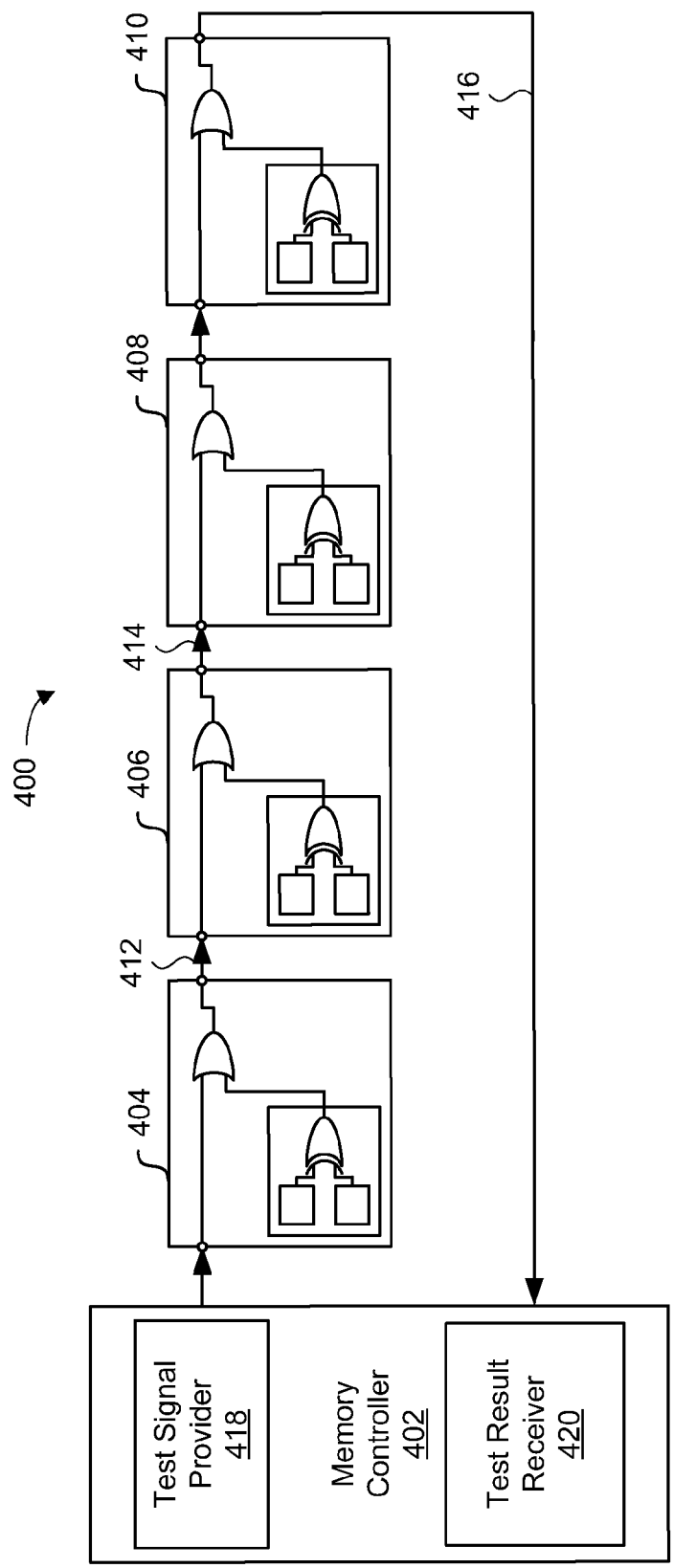
FIG. 4a is a block diagram of serially interconnected testable memory devices according to an embodiment of the present invention.

FIG. 4a is a block diagram of a multi-device system including serially interconnected memory devices. In the present embodiment, multi-device system 400 includes a memory controller 402, and memory devices 404, 406, 408 and 410. Each memory device 404, 406, 408 and 410 is preferably implemented with the memory device 300 of FIG. 3b. The memory controller 402 includes test circuitry therein. The test circuitry includes a test signal provider 418 and a test result receiver 420. The test signal provider 418 provides a test signal containing a test pattern to the first memory device. The test result receiver 420 receives a test signal containing a test result data from the last memory device. Those skilled in the art will understand that memory controller 402 can be any control logic responsible for controlling operation of the memory devices.

During normal operation, the memory controller 402 provides write data to a specific memory device and requests read data from a specific memory device, by providing a device enable signal. In order to simplify the drawing, the connections for communicating command, address and read/write data are not shown. Hence only the addressed device, via a device identifier is enabled for acting upon the command and the address information, while the preceding memory devices allow the command and the address data to flow through, and the following memory devices allow read data to flow through and back to the memory controller 402.

The test mode operation of the multi-device system 400 according to an embodiment of the present invention is now described in more detail. In the test mode, memory controller 402 sends a write command with test pattern data to the first memory device 404. In response to a unique code, value or number, all the devices will be enabled for acting upon the command, address and write data from memory controller 402. The unique code, value or number is not used by the system for any other function, or a test command. Since the memory devices are connected in series with each other, the command, address and write data are transferred from device to device, with a preset latency associated with clocking the data through each memory device. Once the write data has been written into the memory banks of all the memory devices 404, 406, 408 and 410, memory testing according to the embodiments of the invention can proceed. Alternately, the unique code, value or number can be provided to the memory devices. Thereafter, each memory device will read the stored preset test data to determine if any defects exist locally. The local result data, representing the result of the local comparison, is compared with previous global result data, and fed forward to the next memory device where the same comparison is performed.

In FIG. 4a, since memory device 404 is the first memory device in the serial interconnection, its input terminal will receive default "pass" data from memory controller 402. For example, the default pass data can preset to be one or more logic '0' bits. Memory device 404 provides from its output, updated global result data 412 to memory device 406. Memory device 406 then combines the previous global result data received from memory device 404 with its local result data to generate an updated global result data 414. If the local result data from memory device 404 or the local result data from memory device 406 corresponds to a "fail", the updated global result data 412 and 414 will also indicate a "fail". Memory device 406 transmits its updated global result data 414 to memory device 408, which repeats the previously described internal comparisons. Eventually the updated global result data reaches memory device 410, the final memory device in the serial interconnection, which provides a final global result data 416 back to memory controller 402. The final global result data 416 generated by memory device 410 will correspond to a "fail" status if even one memory cell of any device in the serial interconnection is defective.

Figure 4B:
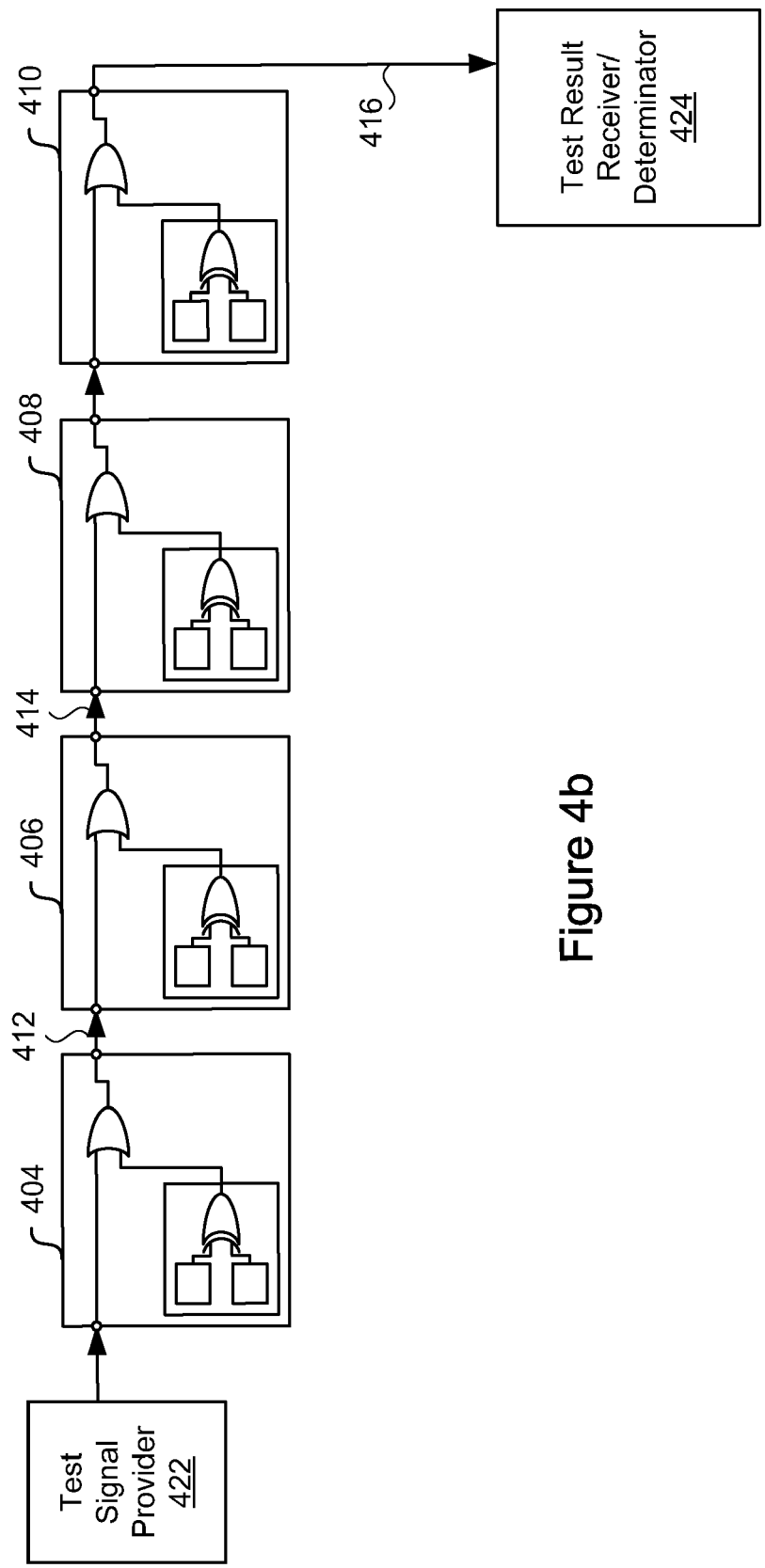
FIG. 4b is a block diagram of serially interconnected testable memory devices according to another embodiment of the present invention.

FIG. 4b shows serially interconnected multi-memory devices according to another embodiment of the present invention. This example is similar to that of FIG. 4a, except that the test signal provider 418 and the test signal receiver 420 can be implemented as logic circuits external to a memory controller, or similar type of controller. Referring to FIG. 4b, a test signal provider 422 and a test result receiver/determinator 424 are configured separately from each other. In this example, four memory devices are serially interconnected. Serially interconnected devices 404, 406, 408 and 410 are connected to the test signal provider 422 and the test result receiver/determinator 424. The test signal provider 422 receiver/determinator 424 performs the same function of the test signal provider 418. The test result receiver/determinator 424 performs the same function of the test signal provider 418 and also performs the function of determining "failure" or "pass" from the final global result data 416 generated by memory device 410.

Figure 5:
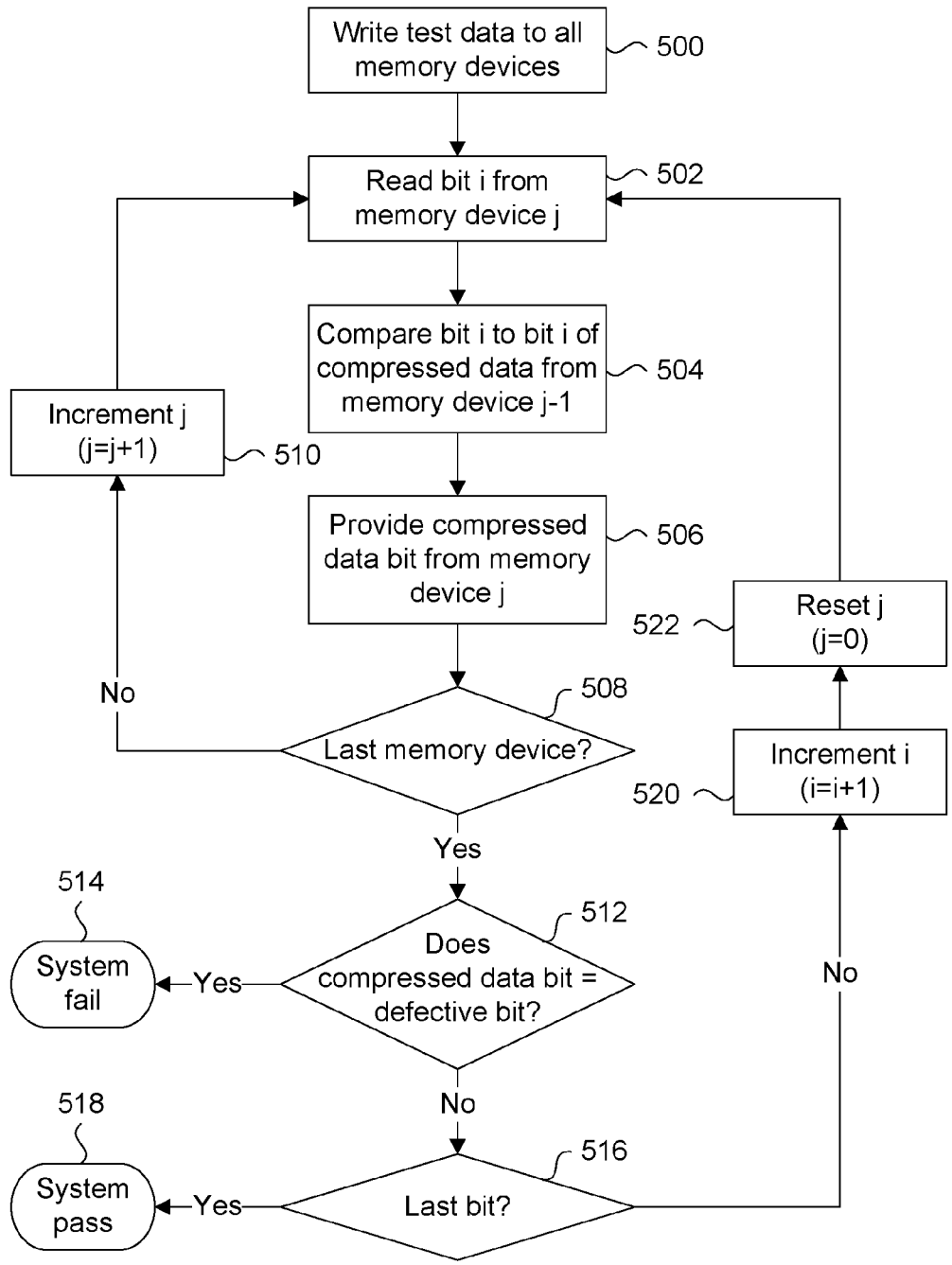
FIG. 5 is a flow chart of a memory system device testing method, according to an embodiment of the present invention.

FIG. 5 is a flow chart showing a method of testing a serially interconnected multi-device memory system, according to an embodiment of the present invention. For the purposes of the present example, each memory device is presumed to have two memory banks, although those skilled in the art will understand that any number of memory banks can be present. Furthermore, those skilled in the art will understand that the embodiments of the present invention are applicable to devices organized to have a single memory array. A detailed description of the memory testing scheme applied to single memory array devices will be described with respect to FIG. 9.

The test method starts at step 500 by writing preset test data to every bank in each memory device. In order to minimize the time required for writing all the memory banks of each memory device, the preset test data is preferably the same in each memory bank. One example of preset test data that may be used is a checkerboard pattern, or all logic "0" data or all logic "1" data. According to an embodiment of the present invention, a write command can be provided to all the memory devices with a unique code, value or number which does not correspond to any device in the system. In response to this unique code, a virtual test mode is entered and all the memory blocks of each memory device are set to receive the preset test data at the same time. Such control can be provided by a command decoder of the device, as should be well known to those skilled in the art. Otherwise, a specific test command can be provided to each of the memory devices to place the system in the test mode of operation.

Once all the memory banks have been written with the preset test data, a first bit position i of the two memory banks of the first memory device j, are read at step 502. Variables i and j start at 0 at step 502. Test circuitry, such as XOR circuit 308 of FIG. 3b for example, is then used for generating a single-bit local result data representing the pass or fail status of bit position i=0 of the two memory banks. At step 504, the local result data for bit position i=0 is compared to bit position i=0 of a previous global result data from a preceding memory device j−1. The first memory device j=0 will receive default "pass" result data from memory controller as there is no preceding memory device in the system. This comparison can be executed by OR circuit 312 of FIG. 3b for example. The output of this comparison is provided as an updated global result data for the current memory device j at step 506.

A determination of the current memory device j as being the last memory device in the system is made at step 508. If the current memory device j is not the last memory device in the system, then the next memory device executes steps 502 to 508 for bit position i=0. This is expressed in the present method by incrementing j (j=j+1) at step 510 and looping back to step 502. Steps 502 to 510 repeat until a final updated global result data is provided by the last memory device, at which point the method proceeds to step 512, indicating that the testing for bit position i=0 for all the memory banks has been completed. A determination of the pass/fail status of the final updated global result data is made at step 512. If the bit status corresponds to a fail, then the method ends at step 514 and the system as a whole is deemed as failing the test, thereby obviating the need to test further bits of the memory banks. On the other hand, if the bit status corresponds to a pass, then the method continues to step 516, where a determination of the last bit position of the memory banks is made. If the final updated global result data corresponds to the last bit position, then the method ends at step 518 and the system as a whole has passed the test.

Otherwise, there are more bit positions remaining to be tested. The method then loops back to step 502 where the next bit position of the memory banks are to be tested, starting with the first memory device of the system. This is expressed in the present method by incrementing i (i=i+1) at step 520, resetting j=0 at step 522, and looping back to step 502. If there are no defects in any of the memory banks, the method repeats the 502 to 510 loop and the 502 to 522 loop to test every bit position in the memory banks of all the memory devices.

Figure 6:
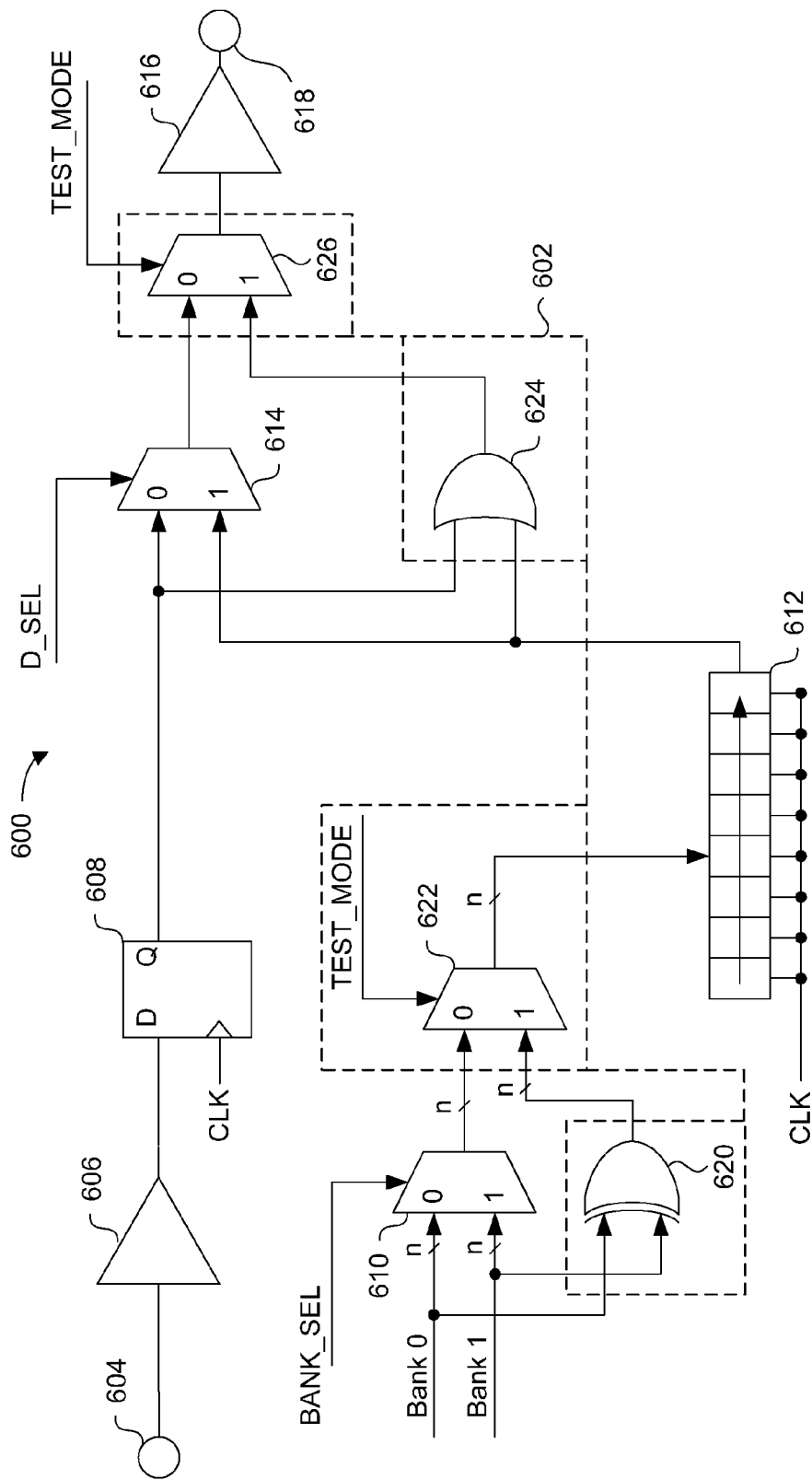
FIG. 6 is a circuit schematic of output path circuitry and compression test circuitry for a memory device, according to an embodiment of the present invention.

FIG. 6 is a detailed schematic embodiment of the memory device 300 illustrated in FIG. 3b. Memory device 600 includes standard output path circuits and a test circuit 602. The standard output path circuits can be further subdivided into a flow-through output path for receiving read/write data from a previous memory device, a local output path for providing local read data, and a shared output driver path for driving data received from either of the flow-through output path and the local output path. The flow-through output path includes an input terminal 604, an input buffer 606, and a D-type flip-flop 608. The local output path includes a memory bank selector 610 and a parallel to serial register 612 of n-bits. The shared output driver path includes a device selector 614, an output buffer 616, and a serial output terminal 618.

The general operation of the output path circuits should be well known to those skilled in the art. By example, the memory bank selector 610 allows individual memory banks to be selected for data read out when the memory device is functioning in a normal mode of operation. Depending on device selection signal D_SEL (related to the device ID number), device selector 614 will pass local data provided by the local output path or global data provided from the flow-through output path. Generally, the local data and the global data passed from device selector 614 are considered memory data during normal operating modes. It is noted that the D-type flip-flop and parallel to serial register 612 are clocked with the same signal CLK in order to ensure that the output data is properly synchronized with the system regardless the source of the data. In flow-through operation, data is therefore subjected to a single clock cycle latency as it is transferred from one memory device to another.

In FIG. 6, the local output path and the shared output driver path are adapted with minimal logic and circuits for enabling the serial test scheme embodiment of the present invention. The additional serial test circuit 602 includes a local comparator circuit 620, a first stage test path selector 622 of n-bits, a compression circuit 624 also referred to as a global comparison circuit, and a second stage test path selector 626. The compression circuit 624 is presently implemented as an OR circuit by example, however, those skilled in the art will understand that any functionally equivalent circuit can be used. The local comparator circuit 620 is implemented as an XOR circuit by example, although any functionally equivalent circuit can be used as long as it can logically detect the presence or absence of defects by comparing memory cell contents. More specifically, any logic circuitry can be used to determine if the memory cell contents mismatch a predetermined pattern, or other expected output, based on the written test pattern. XOR circuit 620 has a first input for receiving a data bit from one bank (Bank 0) and a second input for receiving a data bit from another bank (Bank 1). In the present example, as long as the two bits from Bank 0 and Bank 1 are logically the same, XOR circuit 620 will output a logic "0" result, which corresponds to a "pass" result.

The first stage test path selector 622 is used to selectively pass the output of the memory bank selector 610 which provides local memory data from the memory array, or the output of XOR circuit 620 in response to selection signal TEST_MODE. In the test mode of operation, the single-bit output of XOR circuit 620 is passed to the parallel to serial register 612. This output is the local result data which is to be subsequently compared to the previous global result data from the preceding memory device. In the present example, n-bits from Bank 0 and Bank 1 can be concurrently compared with each other, hence there are n local result data bits that are stored in the parallel to serial register 612. Accordingly, memory bank selector 610, local comparator circuit 620 and first stage test path selector 622 are configured to accommodate an n-bit wide word.

Once loaded, the parallel to serial register 612 provides one single-bit local comparison result to compression circuit 624 on each clock cycle, where it is compared to a corresponding bit of the previous global result data received from D-type flip-flop 608. By example, compression circuit 624 is implemented as an OR logic circuit having a first input connected to the output of parallel to serial register 612 and a second input connected to the output of D-type flip-flop 608. The single-bit output of OR logic circuit 624 combines the previous global result data from a preceding memory device with the local result data contained in the parallel to serial register 612. The second stage test path selector 626 selectively passes the output of OR logic circuit 624 in response to signal TEST_MODE. In the test mode of operation, the output of OR logic circuit 624 is passed to output buffer 616 for transmission to the next memory device, or the memory controller. In a normal mode of operation, second stage test path selector 626 passes global memory data received at the device selector 614.

A discussion of the operation of the standard output path circuits and the additional serial test circuit 602 of memory device 600 now follows. During the test mode of operation, control signal TEST_MODE is set such that the first stage test path selector 622 passes data from its "1" input terminal, and the second stage test path selector 626 passes data from its "1" input terminal. The first stage test path selector 622 passes the result of the comparison of Bank 0 and Bank 1 performed by local comparator circuit 620 to the parallel to serial register 612. In the present example, 8 bits of data from each bank can be simultaneously read out and compared with each other. Hence there are eight comparison results loaded into parallel to serial register 612. On each active clock edge, D-type flip-flop 608 and parallel to serial register 612 transmit single bits of data to compression circuit 624, which combines them and outputs a compressed result. The compressed result passes through the second stage test path selector 626 and is sent to the next memory device in the serial interconnection via the output buffer 616 and the output terminal 618. It is noted that the state of selection signal D_SEL is not relevant here since the output of device selector 614 is blocked at the second stage test path selector 626.

Figure 7A:
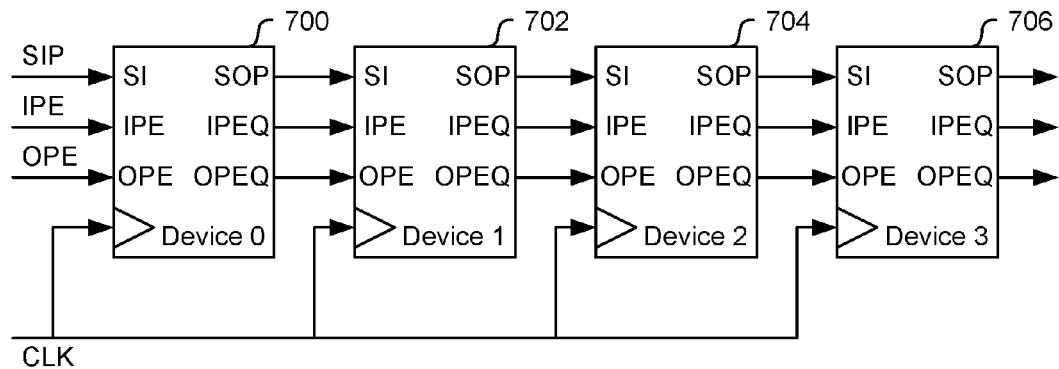
FIG. 7a is a block diagram of serially interconnected memory devices having the compression test circuitry shown in FIG. 6, illustrating the flow of information between memory devices.

FIG. 7a is a block diagram of serial interconnected memory devices 700, 702, 704 and 706 for illustrating the flow of information between devices. Each memory device includes the previously described serial test circuit embodiment shown in FIG. 6. Each memory device has the following input ports: a serial input port SI, an input enable port IPE, an output enable port OPE, and a clock input port. Each memory device has the following output ports: a serial output port SOP, an input enable port IPEQ and an output enable port OPEQ. Output ports IPEQ and OPEQ are flow-through ports which transmit the signals received on the IPE and OPE input ports respectively, to the next device in the system.

Figure 7B:
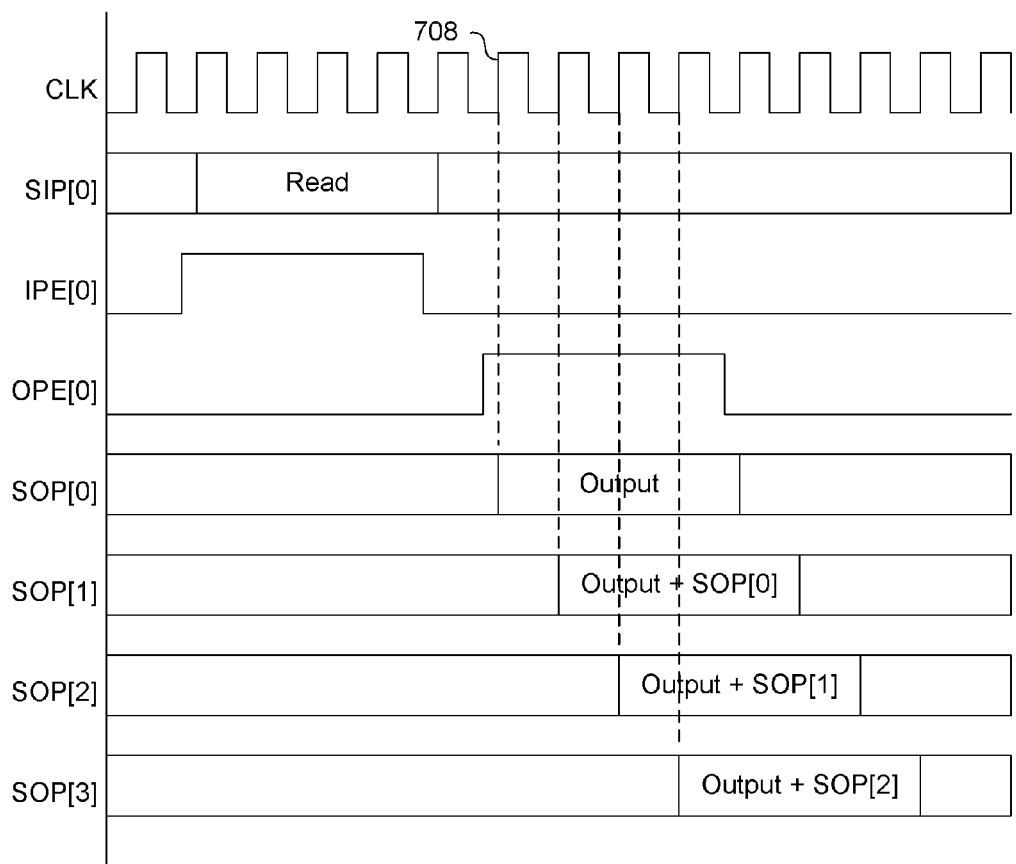

FIG. 7b is a timing diagram showing the operation of the serially interconnected multi-device system of FIG. 7a using the memory testing scheme embodiment of the invention. The timing diagram plots the signal traces for the system clock CLK, the ports SIP, IPE and OPE for memory device 700 "Device 0", labeled SIP[0], IPE[0] and OPE[0] respectively, and the serial output ports for all four devices, labeled SOP[0], SOP[1], SOP[2] and SOP[3]. It is assumed that the test write data has been written to all the memory banks of memory device 700, 702, 704 and 706, and the system of memory devices is ready to be tested.

As can be seen from FIG. 7b, memory device 700 receives an input enable signal IPE in the testing operation. As previously mentioned, the unique code, value or number will enable each device to act on the control signals. The input enable signal IPE[0] is transferred through memory devices 700 through 706, enabling each in turn. Next, the memory device 700 receives a test read command through serial input port SIP[0], which can include setting selection signal TEST_MODE to the necessary test state. For example, signal TEST_MODE can be set to the test state in response to the unique code accompanying the read command, or can be explicitly set when the device enters a test mode of operation. As previously mentioned, the appropriate write circuitry can be activated for enabling simultaneous writing of the test data into the memory cells of one or more memory banks in response to the unique code. Although it is not illustrated in FIG. 7a, the latching circuitry in each of the memory devices 700, 702, 704 and 706 will cause a delay of one clock cycle between the beginning of the read operation in one memory device and the beginning of the read operation in the next memory device in the system. This is referred to as a one clock cycle latency. In response to the read test command, each device will commence local read out and comparison of data between the cells of its memory banks, and load its parallel to serial register 612 with local comparison results.

Once a sufficient number of clock cycles has elapsed for completing the local comparison, an output enable signal OPE is received by memory device 700, which is transferred through memory devices 700, 702, 704 and 706. The first memory device 700 in the system receives the output enable signal OPE, and default "pass" data from the memory controller. This default "pass" data simulates a previous global result data having a "pass" status from a preceding memory device, and is used by OR circuit 624 for the comparison with the local result data. In response to the OPE signal and with a first rising edge of the system clock CLK, a local result data bit from the parallel to serial register 612 of memory device 700 is provided to its corresponding OR circuit 624. Also at the first rising edge, the D-type flip flop circuit of memory device 700 will provide one bit of the default "pass" data to OR circuit 624. In FIG. 7b, the resulting first updated global result data bit is provided on SOP[0] at clock edge 708.

One clock cycle later, memory device 702 latches this first updated global result data bit from SOP[0], and then compares it to a first bit from its own parallel to serial register 612 to generate a second updated global result data bit from SOP[1]. If the data bit from either SOP[0] or the local result data from memory device 702 is indicative of a defect, then SOP[1] will be indicative of a defect as well. This process continues as memory device 704 receives the second updated global result data bit from SOP[1] of memory device 702 and combines it with its own local result data to generate a third updated global result data bit from SOP[2]. Likewise, memory device 706 will provide a fourth and final updated global result data bit from SOP[3], which is returned to the memory controller. As can be seen from FIG. 7*b*, the latching circuitry in each of the memory devices 700, 702, 704 and 706 causes a delay of one clock cycle between the beginning of the output in each memory device and the beginning of the output from the next memory device in the system. The final updated global result data bit from the last memory device 706 in the system is a compressed representation of the comparison results from all of the devices in the multi-device system.

Therefore, the first bit of the final global result data representing the pass/fail status of one memory location of all the memory devices is provided after four clock cycles. For each clock cycle thereafter, successive final global result data bits are provided. The memory controller can be configured to halt the testing process as soon as the first "fail" bit is received, since any single bit failure in any memory device will render the entire system defective.

FIGS. 8*a* and 8*b* conceptually illustrate example operations of three serially interconnected memory devices according to the embodiment the present invention. Each memory device contains two memory banks labeled Bank 0 and Bank 1, an OR circuit, and an XOR circuit. The XOR circuit corresponds to the local comparator circuit 620 of FIG. 6 that determines whether the contents of the two memory banks are the same. The OR circuit corresponds to compression circuit 624 of FIG. 6 that combines the local result data produced by the XOR circuit with the updated global result data of the previous memory device in the system. The output of the OR circuit is an updated global result data. In FIGS. 8*a* and 8*b*, 8 bits of Bank 0 and Bank 1 are tested at the same time.

FIG. 8*a* shows an example situation where there are no defects in any of the 16 memory cells of memory devices 800, 802 and 804. For the purposes of illustration, the same test data 00101101 has been written into memory banks Bank 0 and Bank 1 of devices 800, 802 and 804. Since the memory banks of devices 800, 802 and 804 are not defective, every memory bank will retain the same byte of information. Therefore, during the local comparison operation performed by each device, the result generated by the XOR circuit of each memory device will be 00000000. Memory device 800 combines the test result generated by its XOR gate with the default "pass" data from the memory controller, since device 800 is the first device in the system. Since there are no detected defects, the final compressed data result will be a string of "0" logic states, indicative of a "pass" condition for each memory cell position of all the memory devices.

FIG. 8*b* shows an example situation where there is one defect in Bank 0 of memory device 806, and one defect in Bank 1 of memory device 808. More specifically, after the test data 00101101 is written to all banks of the memory devices, the third bit position from the left in Bank 0 of memory device 806 has switched states from the written "1" logic state to a "0" logic state. Similarly, the eighth bit position from the left in Bank 1 of memory device 808 has switched states from the written "1" logic state to a "0" logic state. Thus, when the XOR circuit of memory device 806 compares eight bits of Bank 0 to the corresponding eight bits of Bank 1, it will generate the following output byte of: 00100000. Similarly, when the XOR circuit of memory device 808 compares eight bits of Bank 0 to the corresponding eight bits of Bank 1, it will generate the following output byte of 00000001. The "1" logic bit indicates a "fail" for the corresponding bit position of one of the two memory banks. Because memory device 806 is the first memory device in the system, its OR circuit merely transmits the output of its XOR circuit to memory device 808. Memory device 808 then combines the updated global result data received from memory device 806 with the local result data generated by its XOR circuit. The updated global result data from memory device 808 now contains two error indications: 00100001. The output of the OR circuit of device 808 is next transmitted to device 810, which combines it with its local result data. Because the data received from device 808 contains error indications, the updated and final compressed data result from the OR gate in device 810 will contain the same error indications, even though device 810 has no defects.

The previously described embodiments have been illustrated using memory devices having two memory banks. In alternate embodiments, the memory devices can include a plurality of memory banks, and the XOR circuit for comparing the data from the memory banks can be configured to receive one bit of data from each of the plurality of memory banks. The single-bit XOR circuit output will still provide an indication of at least one defect in the plurality of memory banks as the circuit is identifying at least one defect amongst all the memory banks. In a modification of FIG. 6 for example, memory bank selector 610 can be configured to receive data from four banks, and XOR circuit 620 would then be correspondingly configured to receive the same data from the four banks.

Alternately, the OR circuit for comparing the previous global result data of a prior memory device can be configured to receive local result data bits from more than one parallel to serial register at the same time. In a modification of FIG. 6 for example, elements 610, 620, 622 and 612 can be duplicated for each pair of memory banks in the memory device.

The previously described multi-device system has been described using memory devices. However, the embodiments of the present invention can be used in any type of device having embedded memory organized into memory banks. The previously described embodiments have been shown in use with devices having at least two memory banks. Those skilled in the art will understand that the shown circuits can be scaled to accommodate additional memory banks. According to another embodiment of the invention, devices having a single memory array can be tested in the same way.

Figure 9:
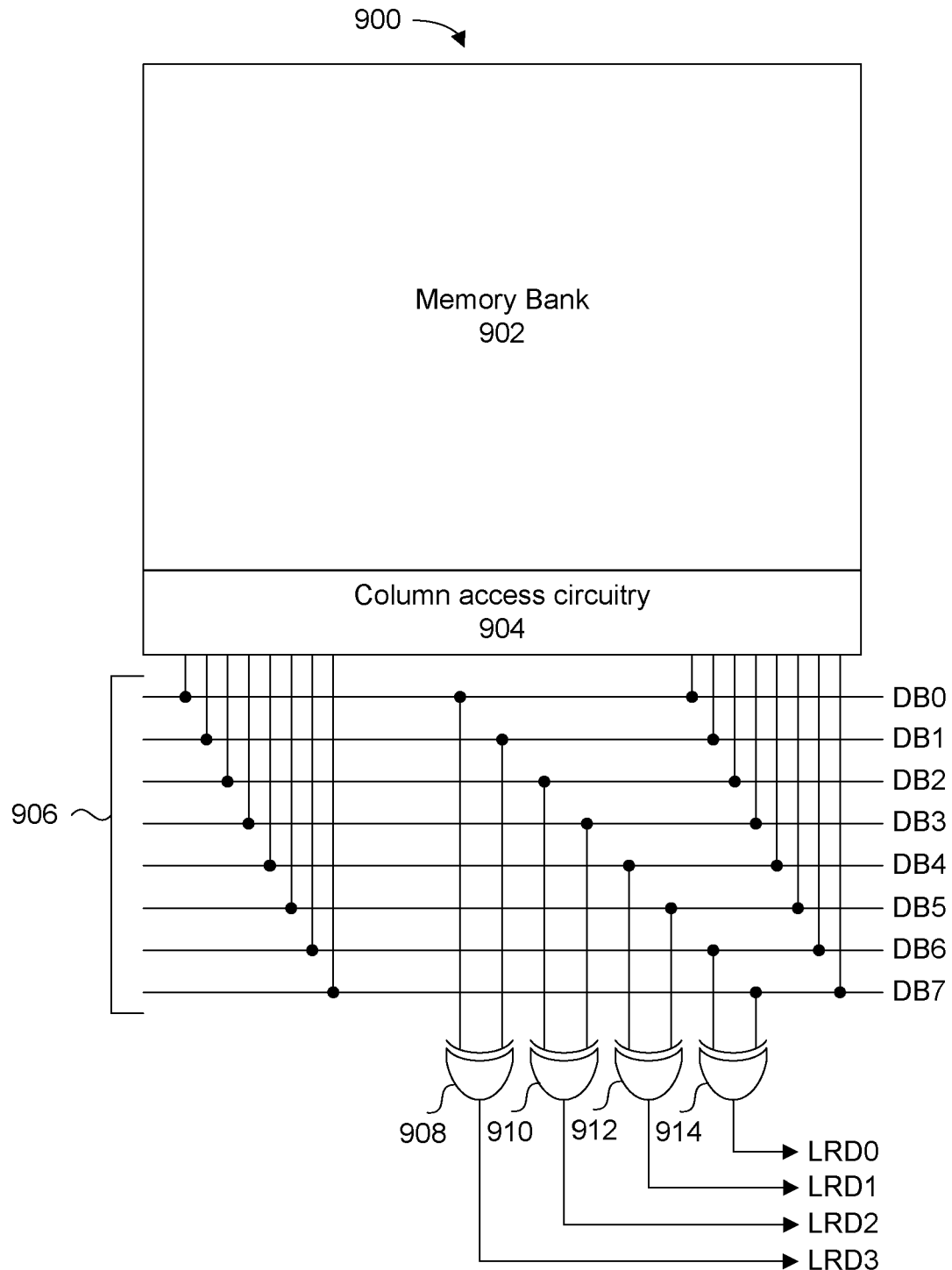
FIG. 9 is a block diagram showing the local comparator circuit configured for a single memory bank device, according to an embodiment of the present invention.

FIG. 9 is a block diagram showing a circuit configuration of the local comparator circuit relative to a single memory bank device. Memory device 900 is configured to have a single memory bank 902 having rows of wordlines and columns of bitlines. Connected to the bitlines are column access circuits 904, which can include bitline sense amplifiers for sensing the voltage levels of the bitlines and column select devices for coupling the sensed voltages onto read databus lines 906. The read databus lines 906 are labeled DB0 to DB7. In the presently shown example, the memory device 900 is configured to provide eight bits of data at the same time onto the read databus lines 906 in each read cycle. In the present embodiment, the local comparator circuit includes one exclusive OR (XOR) circuit for comparing data on two different read databus lines. Hence in the present example of eight read databus lines 906, there are a total of four XOR circuits 908, 910, 912 and 914. The local result data from each of the XOR circuits 908 to 914, labeled LRD0, LRD1, LRD2 and LRD3, can then be provided to downstream circuits similar to those shown in the embodiment of FIG. 6 for comparison to the global result data from the previous memory device.

As such, devices having unitary memory arrays or memory arrays segregated into two or more distinct memory blocks or banks are testable. A segregated memory array is one where its portions are addressable for read or write operations.

The previously shown embodiments have been shown using a single stage of XOR circuits for performing the local comparison of the memory cells in a device. In the embodiment of FIG. 6, there are n XOR circuits 620 for providing n local comparison data bits in parallel. In the embodiment of FIG. 9, there are 4 local comparison data which are provided in parallel. In an alternate embodiment, the local comparison circuits can be organized into stages, such that one single output from a final local comparison circuit can be provided. This final output will then represent the local comparison results of all the memory cells being tested during one read cycle. In a modification of the embodiment of FIG. 9 for example, the outputs LRD0 and LRD1 can be provided to a fifth XOR gate while the outputs LRD2 and LRD3 can be provided to a sixth XOR gate. Then the outputs of the fifth and sixth XOR gates can be provided to a seventh and final XOR gate.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof. In circuit structures, devices and elements may be directly or indirectly connected to or coupled with others.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A memory device comprising:
   memory cells configured to store data;
   test circuitry configured to test the memory cells for defects by simultaneously determining mismatching contents between N pairs of memory cells, where N is an integer number, the test circuitry configured to provide N first signals, each indicative of the defective state or the non-defective state of one of the N pairs of memory cells; and
   an output circuitry configured to update N second signals received by the memory device based on corresponding N first signals.

2. The memory device of claim 1, wherein output circuitry updates the second signal only when the second signal corresponds to a non-defective state and the first signal corresponds to a defective state.

3. The memory device of claim 1, wherein the output circuitry passes through the second signal when the second signal corresponds to a defective state irrespective of the first signal.

4. The memory device of claim 1, wherein all the memory cells are written to store an identical logic state.

5. The memory device of claim 1, wherein the output circuitry includes a register for storing the N first signals.

6. The memory device of claim 5, wherein the register includes a parallel to serial register for receiving the N first signals in parallel, the parallel to serial register being configured to provide each of the N first signals serially in response to a clock signal.

7. The memory device of claim 1, wherein the test circuitry includes a path selector for selectively providing one of read data and the updated second signal to an output terminal.

8. The memory device of claim 7, wherein the path selector provides as the read data external read data provided by another memory device, or local read data provided by the memory device.

9. The memory device of claim 8, wherein the output circuitry includes an input terminal for receiving one of the external read data and the second signal.

10. The memory device of claim 8, wherein the output circuitry includes a device selector for selectively passing one of the external read data and the local read data.

11. The memory device of claim 1, wherein the first signal corresponds to a local defect signal and the second signal corresponds to a global defect signal.

12. A memory device comprising:
   memory cells configured to store data;
   test circuitry including logic circuitry configured to test the memory cells for defects by comparing contents of a first memory cell to a second memory cell, and to provide a first signal indicative of a defective state or a non-defective state, the first signal being provided when the contents of the first memory cell and the second memory cell mismatch; and
   an output circuitry configured to update a second signal received by the memory device based on the first signal.

13. The memory device of claim 12, wherein the logic circuitry includes exclusive OR logic having a first input for receiving the first memory cell content and a second input for receiving the second memory cell content.

14. A memory device comprising:
   memory cells configured to store data;
   test circuitry configured to test the memory cells for defects and to provide a first signal indicative of a defective state or a non-defective state; and
   an output circuitry configured to update a second signal received by the memory device based on the first signal, the output circuitry including a compression circuit for providing the updated second signal in response to the first signal and the second signal, the updated second signal corresponding to a detected defect if at least one of the second signal and the first signal corresponds respectively to a detected defect.

15. The memory device of claim 14, wherein the test circuitry is configured to determine mismatching contents between pairs of memory cells, thereby indicating that at least one of the pairs of memory cells is defective.

16. The memory device of claim 14, wherein the compression circuit includes OR logic having a first input for receiving the first signal and a second input for receiving the first signal.

17. The memory device of claim 14, wherein the compression circuit receives the second signal from the output circuitry, the second signal being provided by another memory device.

18. A memory device comprising:
a first memory bank and a second memory bank having memory cells configured to store data;

the test circuitry configured to test the memory cells for defects by comparing cell data from the first memory bank to cell data of the second memory bank and to provide a first signal indicative of a defective state or a non-defective state; and an output circuitry configured to update a second signal received by the memory device based on the first signal.

* * * * *